(12) United States Patent
Abiko (10) Patent No.: US 6,559,495 B1
(45) Date of Patent: May 6, 2003

(54) SEMICONDUCTOR MEMORY CELL DEVICE

(75) Inventor: Hitoshi Abiko, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 09/667,695

(22) Filed: Sep. 22, 2000

(30) Foreign Application Priority Data

Oct. 1, 1999 (JP) ............................................. 11-281550

(51) Int. Cl.[7] ....................... H01L 27/108; H01L 29/76; H01L 29/94; H01L 31/119
(52) U.S. Cl. ........................................ 257/306; 257/309
(58) Field of Search ................................ 257/295–310; 438/253–254, 396–398

(56) References Cited

U.S. PATENT DOCUMENTS 5,604,696 A * 2/1997 Takaishi ...................... 257/303
6,025,624 A * 2/2000 Figura ......................... 257/306

OTHER PUBLICATIONS

Nikkei Microdevices, Nov. 1993, pp. 29–32.

* cited by examiner

Primary Examiner—Cuong Quang Nguyen
(74) Attorney, Agent, or Firm—McGinn & Gibb, PLLC (57) ABSTRACT

In a memory cell area (A) of a semiconductor storage device, a capacitor (8) formed on a first insulating layer (5) formed so as to cover MOS transistors (3, 4) includes a pillar-shaped insulating member (8a), a first capacitance electrode (8b) formed on the side surface of the pillar-shaped insulating member (8a), a capacitance insulating film (8c) formed on the first capacitance electrode (8b) and a second capacitance electrode (8d) formed on the capacitance insulating film (8c). A conductive member (7) for connecting the source or drain (3a) of the MOS transistor (3) to the first capacitance electrode (8b) is filled in a connection opening (6) formed in the first insulating layer (5). In a peripheral circuit area (B) other than the memory cell area (A) containing plural memory cells each having the MOS transistor (3) and the capacitor (8), a second insulating layer (9) which is formed simultaneously with the formation of the pillar-shaped insulating member (8a) of the capacitor (8) and has the same height as the pillar-shaped insulating member (8a) is formed on the first insulating layer (5).

7 Claims, 7 Drawing Sheets

1 : SEMICONDUCTOR SUBSTRATE
3 : MOS TRANSISTOR
5 : FIRST INSULATING LAYER
6 : CONNECTION OPENING
7 : CONDUCTIVE MEMBER
8 : CAPACITOR
8 a : PILLAR-SHAPED INSULATING MEMBER
8 b : FIRST CAPACITANCE ELECTRODE
8 c : CAPACITANCE INSULATING FILM
8 d : SECOND CAPACITANCE ELECTRODE
9 : SECOND INSULATING LAYER

FIG. 1

A: MEMORY CELL AREA
B: PERIPHERAL CIRCUIT AREA

1 : SEMICONDUCTOR SUBSTRATE
3 : MOS TRANSISTOR
5 : FIRST INSULATING LAYER
6 : CONNECTION OPENING
7 : CONDUCTIVE MEMBER
8 : CAPACITOR
8 a : PILLAR-SHAPED INSULATING MEMBER
8 b : FIRST CAPACITANCE ELECTRODE
8 c : CAPACITANCE INSULATING FILM
8 d : SECOND CAPACITANCE ELECTRODE
9 : SECOND INSULATING LAYER

SEMICONDUCTOR MEMORY CELL DEVICE

BACKGROUND OF THE INVENTION

1. Field of the Invention

The present invention belongs to the technical field of a semiconductor device, and particularly relates to a semiconductor storage device having a memory cell area containing a capacitor and a transistor, and a method of manufacturing the semiconductor storage device.

2. Description of the Related Art

In order to implement high storage capacity, a so-called stack structure in which the electrode of a capacitor constituting a memory cell is three-dimensionally formed and it is disposed while superposed on a transistor has been applied to DRAM as a representative of semiconductor storage devices.

Figure 9:
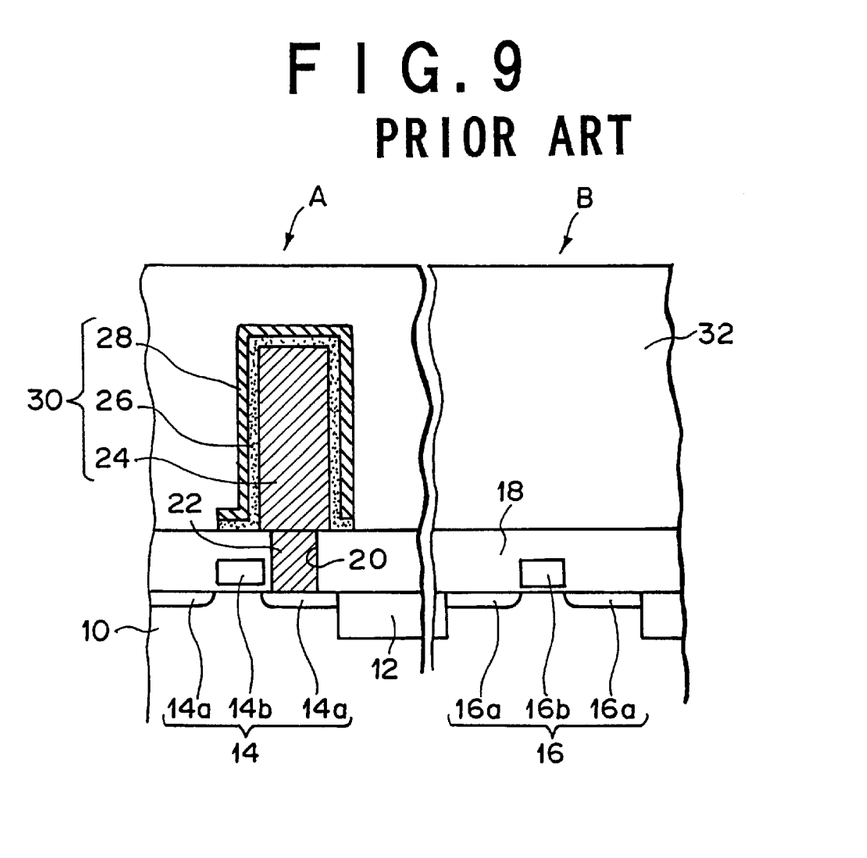
FIG. 9 is a schematic diagram of conventional DRAM.

FIG. 9 is a schematic cross-sectional view showing the conventional DRAM thus constructed.

In FIG. 9, reference symbol A represents a memory cell area and reference symbol B represents a peripheral circuit area. Reference numeral 10 represents a semiconductor substrate, reference numeral 12 represents an element separation oxide film, reference numeral 14 represents a MOS transistor for a memory cell constituting the memory cell area A, and reference numeral 16 represents a MOS transistor constituting the peripheral circuit area B. Further, reference numeral 14a represents the source/drain of the MOS transistor 14, and reference numeral 14b represents the gate of the MOS transistor 14. Reference numeral 16a represents the source/drain of the MOS transistor 16, and reference numeral 16b represents the gate of the MOS transistor 16. Reference numeral 18 represents an insulating layer, and reference numeral 20 represents a connection opening formed in the insulating layer 18 and a conductive member 22 is filled in the connection opening 20.

A cylindrical capacitance stack electrode 24 is formed at the position corresponding to the conductive member 22 on the insulating layer 18, a capacitance insulating film 26 is formed on the side surface and top surface of the capacitance stack electrode 24, and a capacitance plate electrode 28 is formed on the capacitance insulting film 26. These members construct a capacitor 30.

An insulating film (interlayer insulating film) 32 is formed on the insulating layer 18 so as to cover the capacitor 30. Since desired wires are formed on the insulating film 32, the upper surface of the insulating film 32 is flattened to prevent the wires from being broken during the wire forming process.

The process of manufacturing DRAM as described above will be described with reference to FIGS. 10 to 15.

Figure 10:
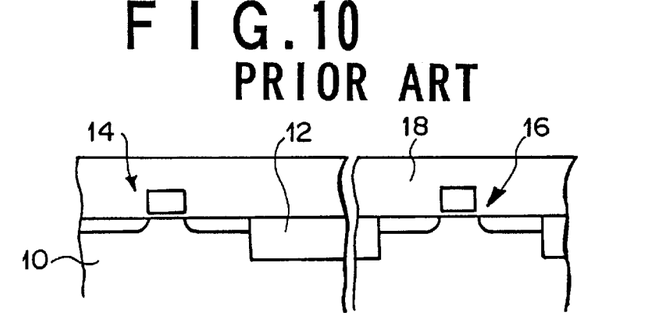
FIG. 10 is a schematic cross-sectional view showing a manufacturing step of the conventional DRAM.

First, as shown in FIG. 10, the element separation oxide film 12 is formed on the semiconductor substrate 10, and the MOS transistors 14, 16 and the insulating layer 18 is formed.

Figure 11:
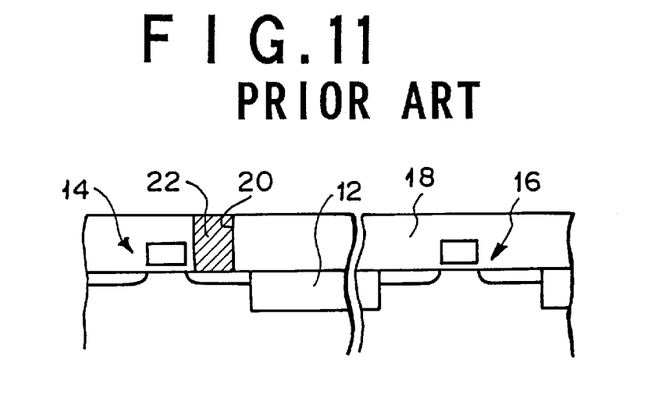
FIG. 11 is a schematic cross-sectional view showing another manufacturing step of the conventional DRAM.

Subsequently, as shown in FIG. 11, the connection opening 20 is formed in the insulting layer 18, and the conductive member 22 is filled into the connection opening 20.

Figure 12:
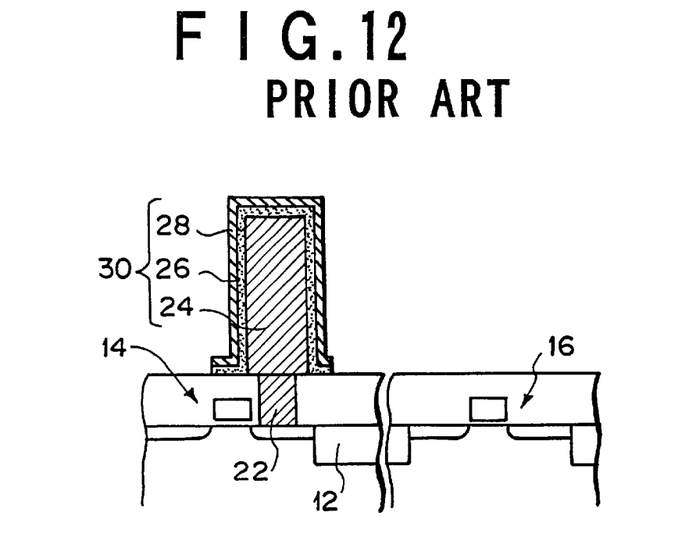
FIG. 12 is a schematic cross-sectional view showing another manufacturing step of the conventional DRAM.

Subsequently, as shown in FIG. 12, the capacitance stack electrode 24 is formed at the position corresponding to the conductive member 22, the capacitance insulating film 26 is formed on the capacitance stack electrode 24, and a capacitance plate electrode 28 is formed on the capacitance insulating film 26, thereby forming the capacitor 30.

Figure 13:
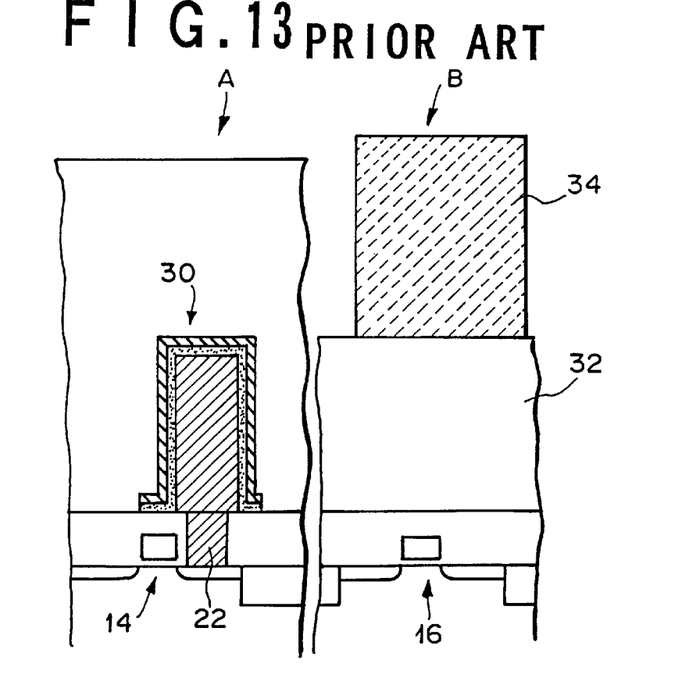
FIG. 13 is a schematic cross-sectional view showing another manufacturing step of the conventional DRAM.

Subsequently, the interlayer insulating film 32 is formed on the insulating layer 18 as shown in FIG. 13. At this time, the upper surface of the interlayer insulating film 32 in the memory cell area A is higher than the upper surface of the interlayer insulating film 32 in the peripheral circuit area B by the amount corresponding to the height of the capacitor 30. Therefore, the interlayer insulating film 32 of the memory cell area A is subjected to an etching treatment so that the upper surface of the interlayer insulting film 32 in the memory cell area A is located at substantially the same height as the upper surface of the interlayer insulating film 32 in the peripheral circuit area B. In order to perform the etching treatment, a photoresist mask 34 is formed on the interlayer insulating film 32 in the peripheral circuit area B.

Figure 14:
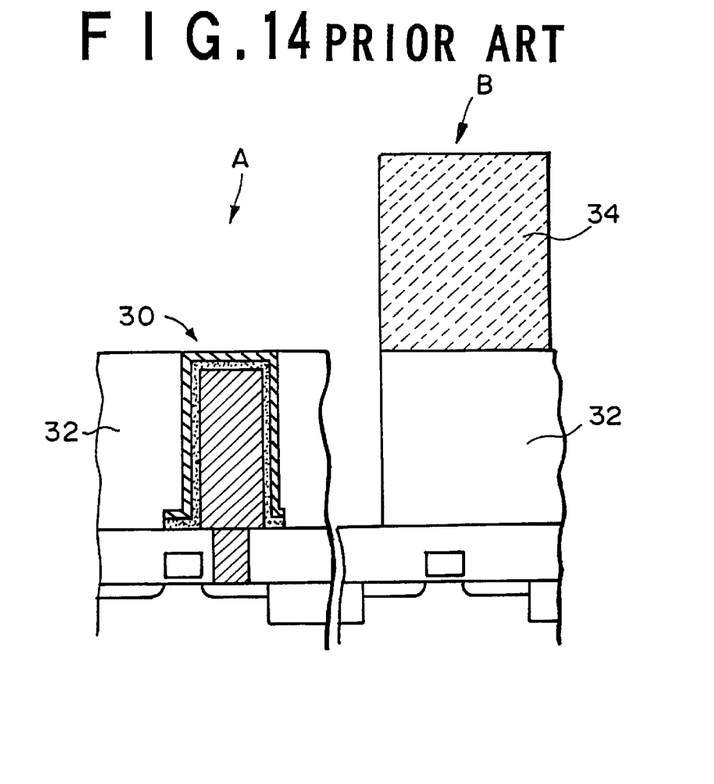
FIG. 14 is a schematic cross-sectional view showing another manufacturing step of the conventional DRAM.

Subsequently, as shown in FIG. 14, the etching treatment is conducted on the interlayer insulating film 32 of the memory cell area A to substantially equalize the height of the interlayer insulating film 32 in the memory cell area A with the height of the interlayer insulating film 32 of the peripheral circuit area B.

Figure 15:
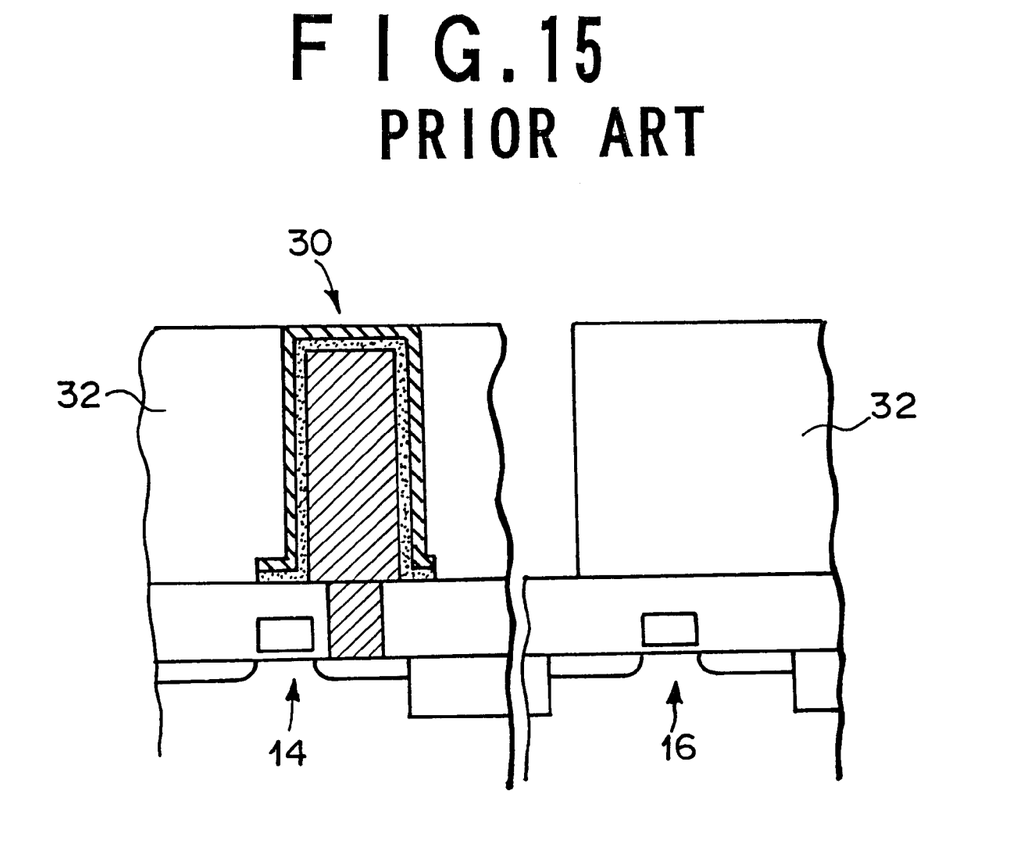
FIG. 15 is a schematic cross-sectional view showing another manufacturing step of the conventional DRAM.

Subsequently, as shown in FIG. 15, the photoresist mask 34 is removed, and if necessary, an insulating film is further deposited to thereby form the interlayer insulating film 32 having the flat upper face (surface), thereby forming DRAM as shown in FIG. 9.

The above DRAM is described in NIKKEI MICRODEVICES, November (1993), p.31.

As described above, in the conventional DRAM, the capacitance stack electrode of the capacitor constituting the memory cell is formed of a pillar-shaped conductor, and thus there occurs a large difference in height (step) between the memory cell area and the peripheral circuit area when the interlayer insulating film is formed. As a result, since it is necessary to secure the flatness of the surface of the interlayer insulating film (particularly between the memory cell area and the peripheral circuit area) in order to smoothly form wires on the interlayer insulating film in the subsequent step, a photolithography step is further needed to selectively remove the interlayer insulating film only in the memory cell area after the interlayer insulating film is deposited as described above, and thus the number of steps is increased.

SUMMARY OF THE INVENTION

Therefore, the present invention has been implemented to solve the foregoing problems of the prior art, and has an object to provide a semiconductor device in.which an insulating film such as an interlayer insulating film having a flat surface can be formed without any specific step of flattening the insulating film after the insulating film is deposited, that is, without increasing the number of steps, and a method of manufacturing the semiconductor device.

In order to attain the above object, according to a first aspect of the present invention, a semiconductor storage device having plural memory cells each containing a capacitor and a transistor is characterized in that a first insulating layer is formed so as to cover the transistor, the capacitor is formed on the first insulating layer, the capacitor contains a pillar-shaped insulating member formed on the first insulating layer, a first capacitance electrode formed on the side surface of the pillar-shaped insulating member, a capacitance insulating film formed on the first capacitance electrode and a second capacitance electrode formed on the capacitance insulating film, the first insulating layer has a connection opening formed therein, and the connection opening is filled with a conductive member for connecting the first capacitance electrode and the transistor to each other.

In the semiconductor storage device described above, a second insulating layer formed of the same insulating material as the pillar-shaped insulating member of the capacitor is preferably formed at the same height as the pillar-shaped insulating member of the capacitor on the first insulating layer in at least a part of an area other than the memory cell area containing the plural memory cells.

In the semiconductor storage device described above, the transistor is preferably a MOS transistor, and the source or drain of the MOS transistor is connected to the conductive member.

According to a second aspect of the present invention, a method of manufacturing a semiconductor storage device having plural memory cells each containing a capacitor and a transistor is characterized by comprising the steps of: forming the transistor on a semiconductor substrate; forming a first insulating layer so that the transistor is covered by the first insulating layer; forming connection openings in the first insulating layer at the positions corresponding to the respective memory cells; filling a conductive member in each of the connection openings; forming an insulating material layer on the first insulating layer; subjecting the insulating material layer to a patterning treatment to form a pillar-shaped insulating member so that a part of the surface of the conductive member filled in each of the connection openings is covered by the pillar-shaped insulating member; forming a first capacitance electrode on the side surface of the pillar-shaped insulating member, connecting the first capacitance electrode and the conductive member to each other, forming a capacitance insulating film on the first capacitance electrode, and forming a second capacitance electrode on the capacitance insulating film.

In the semiconductor storage device manufacturing method described above, the patterning treatment of the insulating material layer is preferably performed by using anisotropic etching.

In the above semiconductor storage device manufacturing method, the formation of the first capacitance electrode is preferably performed by forming a conductive material layer and patterning the conductive material layer with anisotropic etching.

In the above semiconductor storage device manufacturing method, the transistor is preferably a MOS transistor, and each connection opening is formed at the position corresponding to the source or drain of the MOS transistor.

In the above semiconductor storage device manufacturing method, it is preferable that the insulating material layer is also formed in an area other than the memory cell area containing the plural memory cells on the semiconductor substrate, and the insulating material layer is subjected to a patterning treatment so that a second insulating layer having the same height as the pillar-shaped insulating member of the capacitor remains in the area other than the memory cell area.

According to the present invention, the capacitor of the memory cell area is constructed while containing the pillar-shaped insulating member, and the pillar-shaped insulating member is formed simultaneously with formation of the interlayer insulating film in the area other than the memory cell area. Therefore, the surface flattening between the memory cell area and the other area can be easily performed without increasing the number of steps.

DETAILED DESCRIPTION OF THE PREFERRED EMBODIMENTS

Preferred embodiments according to the present invention will be described hereunder with reference to the accompanying drawings.

Figure 1:
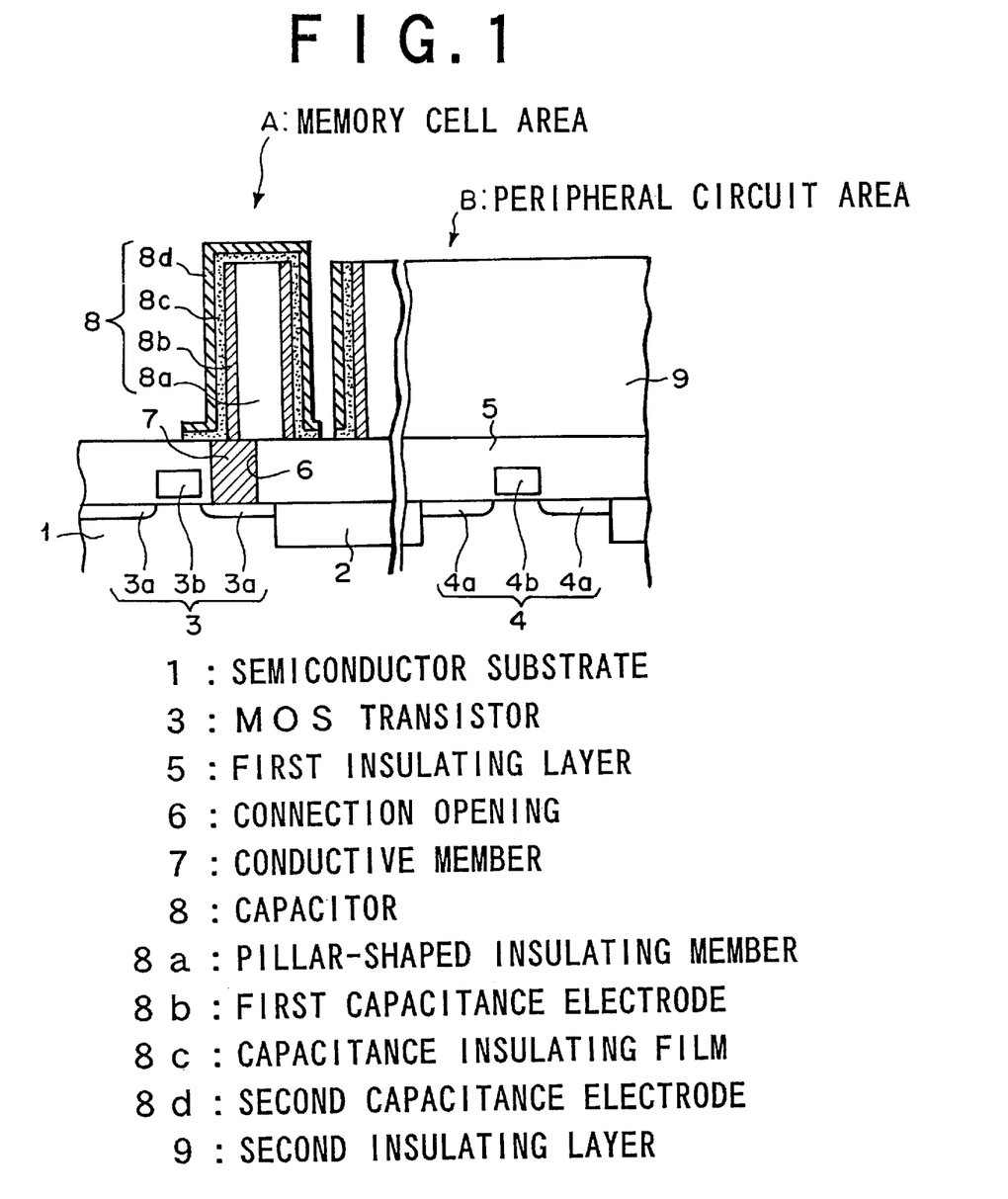
FIG. 1 is a schematic cross-sectional view showing DRAM according to an embodiment of a semiconductor storage device of the present invention.

FIG. 1 is a schematic cross-sectional view of DRAM according to an embodiment of a semiconductor storage device of the present invention.

In FIG. 1, reference symbol A represents a memory cell area, and reference symbol B represents a peripheral circuit area located so as to be adjacent to the memory cell area A. Reference numeral 1 represents a semiconductor substrate, reference numeral 2 represents an element separation oxide film, reference numeral 3 represents a MOS transistor of one memory cell constituting the memory cell area A, and reference numeral 4 represents a MOS transistor constituting the peripheral circuit area B. Reference numeral 3a represents the source/drain of the MOS transistor 3, and reference numeral 3b represents the gate of the MOS transistor 3. Reference numeral 4a represents the source/drain of the MOS transistor 4, and reference numeral represents the gate of the MOS transistor 4.

Reference numeral 5 represents a first insulating layer, reference numeral 6 represents a connection opening formed in the insulating layer 5, and a conductive member 7 is filled in the connection opening 6. The lower end portion of the conductive member 7 is connected to one of the source/drain 3a of the MOS transistor 3.

In the memory cell area A, the capacitor 8 constituting the memory cell is formed on the insulating layer 5. The capacitor 8 has a pillar-shaped insulating member 8a, a first capacitance electrode 8b formed on the side surface of the pillar-shaped insulating member 8a, a capacitance insulating film 8c which is formed so as to cover the pillar-shaped insulating member 8a and the first capacitance electrode 8b, and a second capacitance electrode 8d which is formed so as to cover the capacitance insulating film 8c. The pillar-shaped insulating member 8a is disposed so that a part of the lower end portion of the pillar-shaped insulating member 8a is connected to the upper end portion of the conductive member 7, and the lower end portion of the first capacitance electrode 8b is connected to the upper end portion of the conductive member 7.

In the peripheral circuit area B, a second insulating layer 9 is formed on the insulating layer 5. The second insulating layer 9 is formed at the same height as the pillar-shaped insulating member 8a of the capacitor 8, and formed of the same insulating material as the pillar-shaped insulating member 8a of the capacitor 8. The second insulating layer 9 serves as an interlayer insulating film.

As not shown, an insulating film or a wiring layer may be formed on the structure shown in FIG. 1.

The manufacturing process of the above DRAM will be described with reference to FIGS. 1 to 8.

Figure 2:
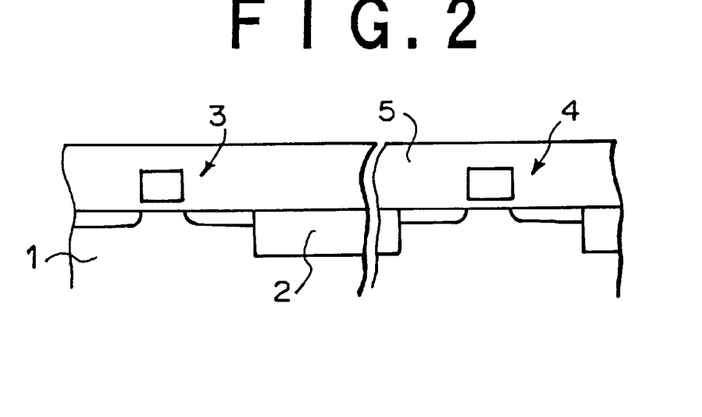
FIG. 2 is a schematic cross-sectional view showing a manufacturing step of DRAM of FIG. 1.

First, as shown in FIG. 2, the element separation oxide film 2 is formed on the semiconductor substrate 1, and the MOS transistors 3, 4 and the first insulating layer 5 are formed.

Figure 3:
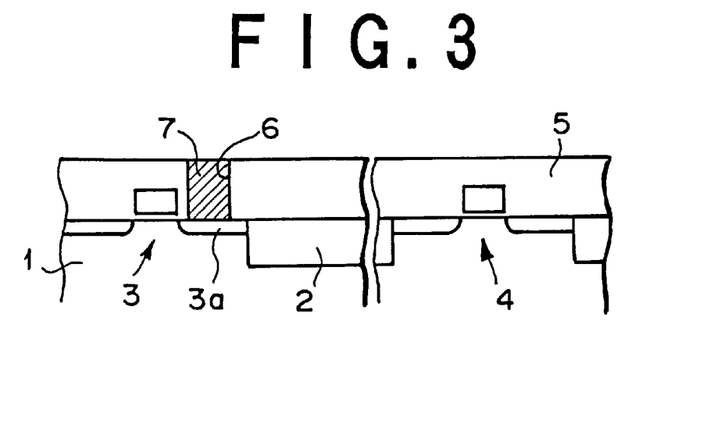
FIG. 3 is a schematic cross-sectional view showing another manufacturing step of DRAM of FIG. 1.

Subsequently, as shown in FIG. 3, the connection opening 6 is formed at the position corresponding to one of the source/drain 3a of the MOS transistor 3 in the insulating layer 5, and the conductive member 7 is filled in the connection opening 6 thus formed, whereby the conductive member 7 is connected to the source/drain 3a.

Figure 4:
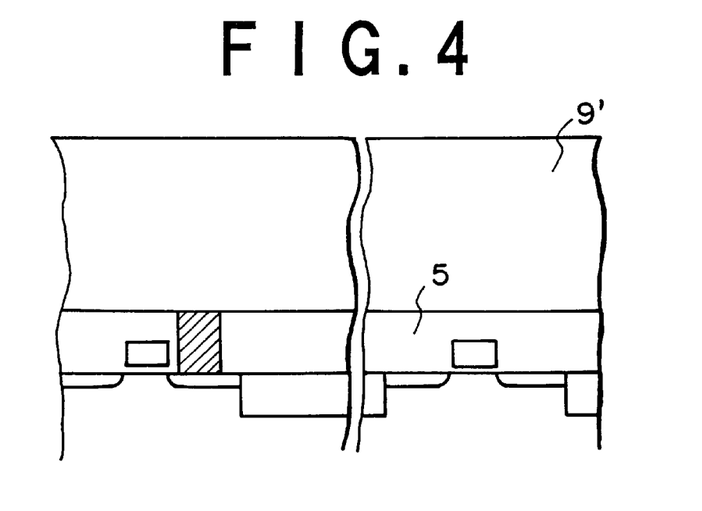
FIG. 4 is a schematic cross-sectional view showing another manufacturing step of DRAM of FIG. 1.

Subsequently, as shown in FIG. 4, an insulating material layer 9' is formed on the insulating layer 5 in the memory cell area A and the peripheral circuit area B.

Figure 5:
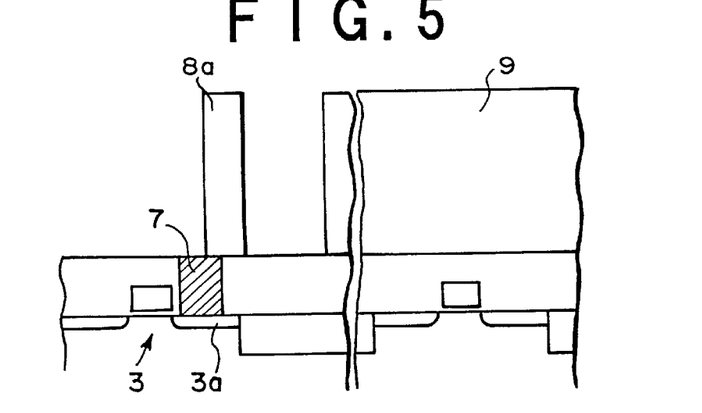
FIG. 5 is a schematic cross-sectional view showing another manufacturing step of DRAM of FIG. 1.

Subsequently, as shown in FIG. 5, a mask pattern is formed by photolithography, and anisotropic etching is conducted to subject the insulating material layer 9' to a patterning treatment, thereby forming the pillar-shaped insulting member 8a such as cylindrical insulating member in the memory cell area A and the second insulating layer 9 in the peripheral circuit area B. Accordingly, the pillar-shaped insulating member 8a and the second insulating layer 9 are formed of the same material and the same height. A part of the upper portion of the conductive member 7 is covered by the pillar-shaped insulating member 8a, but the other part is exposed.

Figure 6:
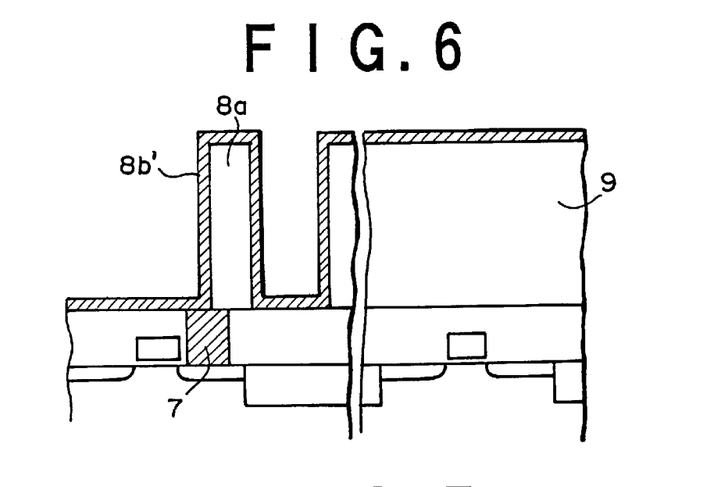
FIG. 6 is a schematic cross-sectional view showing another manufacturing step of DRAM of FIG. 1.

Subsequently, as shown in FIG. 6, a conductive film 8b' is deposited on the overall surface of the intermediate product shown in FIG. 5 by a method such as CVD method or the like which is excellent in step coverage performance.

Figure 7:
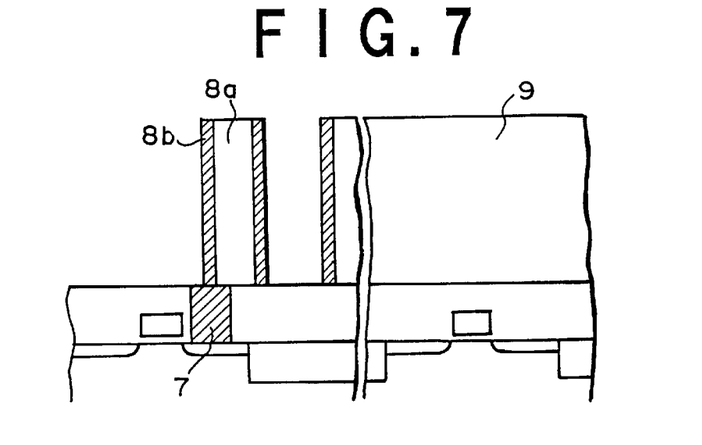
FIG. 7 is a schematic cross-sectional view showing another manufacturing step of DRAM of FIG. 1.

Subsequently, as shown in FIG. 7, by conducting the anisotropic etching, the conductive film is left only at the side surface of the pillar-shaped insulating member 8a in the memory cell area A to form the first capacitance electrode 8b. At this time, the lower end portion of the first capacitance electrode 8b is connected to the conductive member 7.

Figure 8:
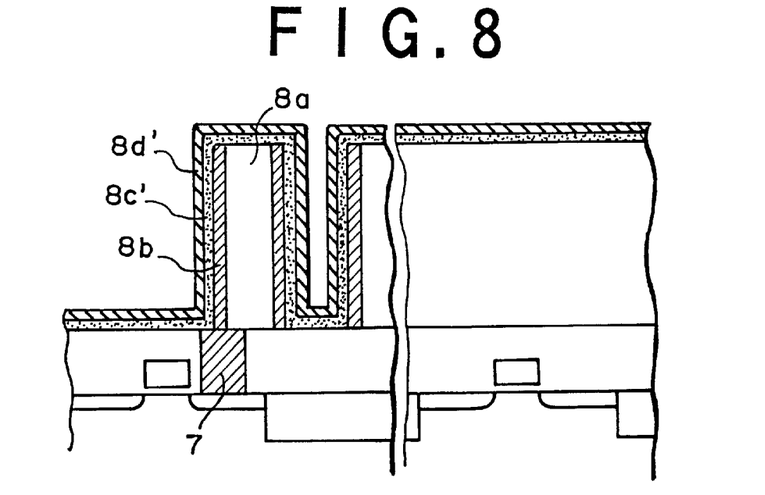
FIG. 8 is a schematic cross-sectional view showing another manufacturing step of DRAM of FIG. 1.

Subsequently, as shown in FIG. 8, an insulating film 8c' is deposited and formed on the overall surface of the intermediate product shown in FIG. 7 by the method such as CVD method which is excellent in step coverage performance, and a conductive film 8d' is deposited and formed on the insulating film 8c'. Thereafter, the conductive film 8d' and the insulating film 8c' are subjected to patterning, thereby obtaining the semiconductor storage device shown in FIG. 1.

As described above, according to this embodiment, the pillar-shaped insulating member 8a and the second insulating layer 9 are formed by the patterning of the insulating material layer 9', and thus they are formed of the same insulating material and are formed at the same height. Accordingly, without increasing the number of steps, there can be easily prevented occurrence of the difference in height between the surfaces of the memory cell area A and the other area.

What is claimed is:

1. A semiconductor storage device comprising:

a plurality of memory cells each containing a capacitor and a transistor, wherein a first insulating layer is formed so as to cover said transistor, said capacitor is formed on said first insulating layer, said capacitor includes:
 a pillar-shaped insulating member formed on said first insulating layer,
 a first capacitance electrode formed on a side surface of said pillar-shaped insulating member, and
 a capacitance insulating film formed on said first capacitance electrode and a second capacitance electrode formed on said capacitance insulating film, said first insulating layer having a connection opening formed therein, and said connection opening being filled with a conductive member with an upper surface directly contacts a lower surface of the pillar-shaped insulating member, a lower surface of said first capacitance electrode and a lower surface of said capacitance insulating film, and a lower surface of the connection contacting to said transistor.

2. The semiconductor device according to claim 1, wherein a second insulating layer with a flat surface formed on the same insulating material as said pillar-shaped insulating member of said capacitor is formed at the same height as said pillar-shaped insulating member of said capacitor on said first insulating layer in at least a part of an area other than the memory cell area containing the plural memory cells.

3. The semiconductor storage device as claimed in claim 1, wherein said transistor is a MOS transistor, and the source or drain of said MOS transistor is connected to said conductive member.

4. The semiconductor storage device as claimed in claim 2, wherein said transistor comprises a MOS transistor, and the source or drain of said MOS transistor is connected to said conductive member.

5. The semiconductor storage device according to claim 2, wherein said pillar-shaped insulating member and said second insulating layer are patterned from an insulating material layer of said first insulating layer.

6. The semiconductor storage device according to claim 2, wherein said pillar-shaped insulating member and said second insulating layer are substantially the same height and formed from an identical insulating material.

7. A semiconductor storage device comprising:

a plurality of memory cells each containing a capacitor and a transistor, a first insulating layer is formed to cover said transistor with said capacitor formed on said first insulating layer, said capacitor includes:
 a pillar-shaped insulating member formed on said first insulating layer,
 a first capacitance electrode formed on a side surface of said insulating member;

a conductive member formed within said first insulating layer; and an upper surface of conductive member directly contact to a part of a lower surface of said insulating member, a lower surface of said first capacitance electrode and a lower surface of a capacitance insulating film of said capacitor, and a lower surface of conductive member connecting to said transistor.

* * * * *